(12) United States Patent
Jo et al.

(10) Patent No.: US 10,326,103 B2
(45) Date of Patent: Jun. 18, 2019

(54) DISPLAY DEVICE HAVING BUFFER PATTERNS

(71) Applicant: Samsung Display Co., Ltd., Yongin-si, Gyeonggi-do (KR)

(72) Inventors: Min Jun Jo, Cheonan-si (KR); Yong Seung Park, Yangpyeong-gun (KR); Ja Woon Lee, Seoul (KR); Jae Kyung Go, Yongin-si (KR); Chang Woo Shim, Cheonan-si (KR); Hyun Min Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/833,800

(22) Filed: Dec. 6, 2017

(65) Prior Publication Data
US 2018/0233697 A1 Aug. 16, 2018

(30) Foreign Application Priority Data
Feb. 14, 2017 (KR) .................. 10-2017-0019943

(51) Int. Cl.
*H01L 51/52* (2006.01)
*H01L 51/56* (2006.01)
*H01L 27/32* (2006.01)

(52) U.S. Cl.
CPC ........ *H01L 51/5246* (2013.01); *H01L 51/525* (2013.01); *H01L 51/56* (2013.01); *H01L 27/3244* (2013.01); *H01L 2251/566* (2013.01)

(58) Field of Classification Search
CPC .................. H01L 51/5246; H01L 51/525
See application file for complete search history.

(56) References Cited

U.S. PATENT DOCUMENTS

| 5,336,931 A * | 8/1994 | Juskey .................. H01L 23/24 174/522 |
| 5,978,061 A * | 11/1999 | Miyazaki ............ G02F 1/13394 349/106 |
| 6,285,203 B1 * | 9/2001 | Akram ................. G01R 1/0483 324/750.25 |
| 7,306,346 B2 * | 12/2007 | Fukuoka ............. H01L 51/5246 313/512 |
| 7,733,457 B2 * | 6/2010 | Tashiro ................. G02F 1/1303 349/153 |
| 7,786,668 B2 * | 8/2010 | Hayashi .............. H01L 27/3276 313/504 |
| 8,022,625 B2 * | 9/2011 | Hayashi .............. H01L 51/5246 313/498 |

(Continued)

FOREIGN PATENT DOCUMENTS

KR 10-2005-0070402 A 7/2005
KR 10-2010-0052895 A 5/2010

(Continued)

*Primary Examiner* — Ida M Soward
(74) *Attorney, Agent, or Firm* — Lewis Roca Rothgerber Christie LLP

(57) ABSTRACT

A display device includes a first substrate having a display area and a non-display area around the display area, a seal pattern in the non-display area and offset from the display area, and one or more buffer patterns between the seal pattern and the display area and having a viscosity of 5000 cps to 50000 cps.

15 Claims, 17 Drawing Sheets

(56) References Cited

U.S. PATENT DOCUMENTS

| | | | |
|---|---|---|---|
| 8,648,345 B2* | 2/2014 | Yamazaki | G09G 3/3275 |
| | | | 257/59 |
| 8,884,849 B2* | 11/2014 | Masuda | H01L 27/3272 |
| | | | 345/76 |
| 9,105,869 B2* | 8/2015 | Nishido | H01L 51/0097 |
| 9,146,440 B2* | 9/2015 | An | G02F 1/167 |
| 9,482,904 B2* | 11/2016 | Miyazaki | G02F 1/1339 |
| 9,547,192 B2* | 1/2017 | Fujita | G02F 1/13338 |
| 9,773,998 B2* | 9/2017 | Chida | H01L 51/5246 |
| 9,793,443 B2* | 10/2017 | Aoyagi | H01L 25/0753 |
| 9,922,846 B2* | 3/2018 | Han | H01L 21/563 |
| 10,126,603 B2* | 11/2018 | Kim | G02F 1/1339 |
| 10,134,774 B2* | 11/2018 | Han | H05K 999/99 |
| 2005/0155704 A1* | 7/2005 | Yokajty | H01L 51/5246 |
| | | | 156/295 |
| 2006/0103301 A1* | 5/2006 | Spencer | H01L 51/5246 |
| | | | 313/512 |
| 2007/0170605 A1* | 7/2007 | Lee | H01L 51/5246 |
| | | | 264/1.1 |
| 2016/0218320 A1* | 7/2016 | Chen | H01L 51/5256 |

FOREIGN PATENT DOCUMENTS

| | | | |
|---|---|---|---|
| KR | 10-2016-0017273 A | 2/2016 | |
| KR | 10-1676520 B1 | 11/2016 | |

\* cited by examiner

DISPLAY DEVICE HAVING BUFFER PATTERNS

CROSS-REFERENCE TO RELATED APPLICATION

This application claims priority to, and the benefit of, Korean Patent Application No. 10-2017-0019943, filed on Feb. 14, 2017, the disclosure of which is incorporated herein by reference in its entirety.

BACKGROUND

1. Field

Aspects of the present disclosure relate to a display device and a manufacturing method thereof.

2. Description of the Related Art

Display devices have increasingly become important as a result of developments in multimedia technology. Accordingly, various types of display devices such as liquid crystal display (LCD) devices, organic light-emitting display devices, and the like have been used.

The organic light-emitting display device includes a hole injection electrode, an electron injection electrode, and an organic light-emitting layer formed between the hole injection electrode and the electron injection electrode. The organic light-emitting display device is a type of self-emissive display device that generates light in response to excitons, formed by the combination of holes injected from the hole injection electrode and electrons injected from the electron injection electrode, falling from an excited state to a ground state.

Because the organic light-emitting display device, which is a self-emissive display device, does not need a light source, the organic light-emitting display device can be driven at a low voltage, can be fabricated as a thin, light-weighted display device, and has many high-quality properties such as a wide viewing angle, high contrast ratio, and high response speed. Accordingly, the organic light-emitting display device has long been considered as a next-generation display device.

SUMMARY

Aspects of exemplary embodiments of the present disclosure are directed to a display device with an improved durability.

Aspects of exemplary embodiments of the present disclosure are also directed to a manufacturing method of a display device with an improved durability.

According to an exemplary embodiment of the present disclosure, there is provided a display device including: a first substrate having a display area and a non-display area around the display area; a seal pattern in the non-display area and offset from the display area; and one or more buffer patterns between the seal pattern and the display area and having a viscosity of 5000 cps to 50000 cps.

In an embodiment, a middle area is defined between the display area and the seal pattern, and the one or more buffer patterns are in the middle area.

In an embodiment, a width of the one or more buffer patterns is less than a width of the middle area.

In an embodiment, the middle area has a first side and a second side opposite to the first side, and the first side has a greater area than the second side.

In an embodiment, the middle area further has third and fourth sides connecting the first and second sides.

In an embodiment, the one or more buffer patterns are on at least one of the first through fourth sides.

In an embodiment, the one or more buffer patterns are arranged in a single row on each of the third and fourth sides.

In an embodiment, the one or more buffer patterns include a plurality of buffer patterns, and a total area occupied by ones of the plurality of buffer patterns on the first side is greater than a total area occupied by ones of the plurality of buffer patterns on the second side.

In an embodiment, the one or more buffer patterns on the first side are arranged in a matrix of rows and columns.

In an embodiment, the one or more buffer patterns have an elongated bar shape.

In an embodiment, the one or more buffer patterns have adhesiveness.

In an embodiment, the buffer patterns include silicon.

In an embodiment, the one or more buffer patterns include a plurality of buffer patterns, and the plurality of buffer patterns are in contact with one another.

In an embodiment, the one or more buffer patterns include a plurality of buffer patterns, and the plurality of buffer patterns are spaced from one another.

In an embodiment, the display device further includes: outer buffer patterns on the outside of the seal pattern.

According to an exemplary embodiment of the present disclosure, there is provided a manufacturing method of a display device, the method including: forming a seal pattern on a second substrate; forming one or more buffer patterns on the inside of the seal pattern; preparing a first substrate opposite to the first substrate and on which a display area and a non-display area on the outside of the display area are defined; bonding the first and second substrates; and partially curing the one or more buffer patterns by applying heat, wherein the one or more buffer patterns have a viscosity of 5000 cps to 50000 cps.

In an embodiment, the bonding of the first and second substrates includes aligning the non-display area of the first substrate and the one or more buffer patterns of the second substrate.

In an embodiment, the seal pattern includes frit, and the bonding of the first and second substrates includes curing the frit by applying laser light to the seal pattern.

In an embodiment, the one or more buffer patterns have adhesiveness.

In an embodiment, the one or more buffer patterns include silicon.

According to the aforementioned and other exemplary embodiments of the present disclosure, the durability of a display device may be improved.

Also, the bonding between first and second substrates of a display device may be stably maintained.

Exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

The aspects and features of the present invention and methods for achieving the aspects and features will be apparent by referring to the embodiments to be described in detail with reference to the accompanying drawings. However, the present invention is not limited to the embodiments disclosed hereinafter, and may be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

Hereinafter, embodiments of the present invention will be described with reference to the attached drawings.

Figure 1:
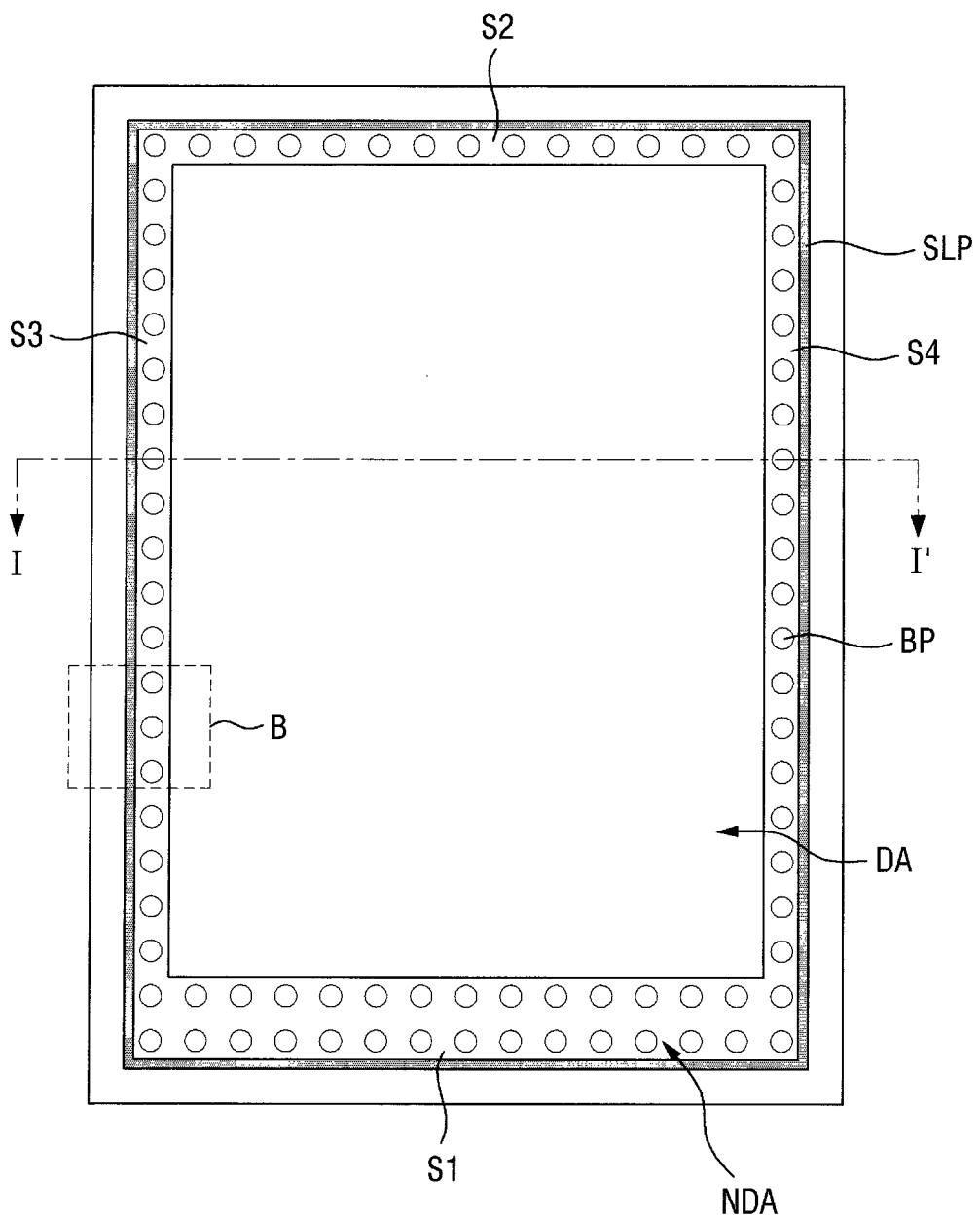
FIG. 1 is a layout view of a display device according to an exemplary embodiment of the present disclosure.
Figure 2:
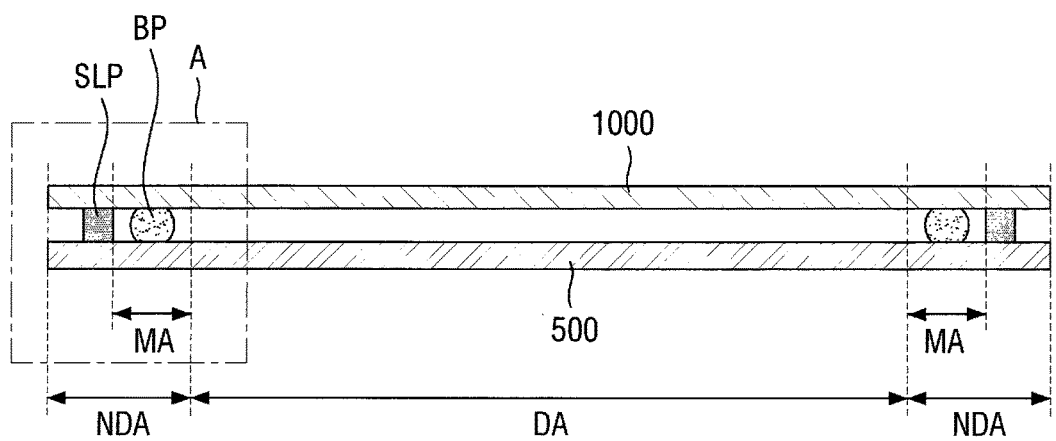
FIG. 2 is a cross-sectional view taken along the line I-I' of FIG. 1.
Figure 3:
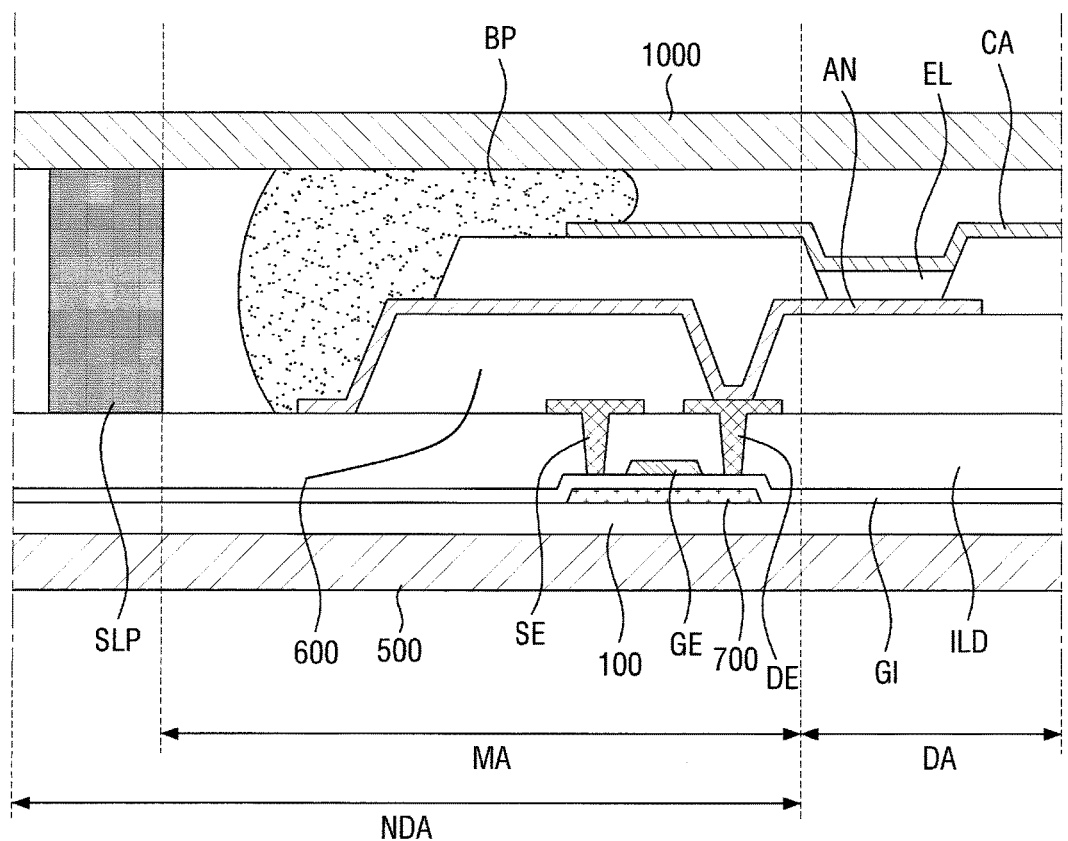
FIG. 3 is an enlarged view of the area A of FIG. 2.

FIG. 1 is a layout view of a display device according to an exemplary embodiment of the present disclosure. FIG. 2 is a cross-sectional view taken along the line I-I' of FIG. 1. FIG. 3 is an enlarged view of the area A of FIG. 2.

Referring to FIGS. 1 through 3, the display device according to the exemplary embodiment of FIG. 1 includes a first substrate 500 on which a display area DA and a non-display area on the outside of the display area DA are defined, a seal pattern SLP, which is disposed in the non-display area NDA to be spaced apart from the display area DA, and buffer patterns BP, which are disposed between the seal pattern SLP and the display area DA and have a viscosity of 5000 cps to 50000 cps.

The first substrate 500 is an insulating substrate and may include a polyimide (PI), polyethylene terephthalate (PET), polycarbonate (PC), polyethylene naphtalate (PEN), polyarylate (PAR), polyetherimide (PEI), and/or the like.

However, the material of the first substrate 500 is not limited thereto. For example, the first substrate 500 may include a material such as a metal, glass, and/or the like.

In an example, the first substrate 500 may be a flexible substrate. In other words, the first substrate 500 may be a flexible substrate that is bendable, rollable, and/or foldable.

The display area DA and the non-display area NDA may be defined on the first substrate 500.

The display area DA is an area in which an image is displayed, and the non-display area NDA is an area in which various signal lines or power lines are disposed for displaying an image in the display area DA.

In the display area DA, a plurality of pixels may be arranged or defined, and at least one thin-film transistor (TFT) and at least one organic light-emitting element may be disposed in each of the pixels. This will be described later in further detail.

In an example, a plurality of pads may be formed on one side of the non-display area NDA. In an example, the display device according to the exemplary embodiment of FIG. 1 may further include a power supply device or a signal generation device, and electrical signals provided by the power supply device or the signal generation device may be transmitted to the display area DA via the pads.

Referring to FIG. 3, a buffer layer 100 is disposed on the first substrate 500. The buffer layer 100 may be formed on the entire surface of the first substrate 500. In other words, the buffer layer 100 may be disposed to cover both the display area DA and the non-display area NDA.

The buffer layer 100 may reduce or prevent the infiltration of impurities via the first substrate 500 and may planarize the top surface of the first substrate 500.

In an example, the buffer layer 100 may include silicon oxide, silicon nitride, silicon oxynitride, aluminum oxide, aluminum nitride, titanium oxide, titanium nitride, and/or the like.

In another example, the buffer layer 100 may include PI, polyester, acrylic, and/or the like.

FIG. 3 illustrates an example in which the buffer layer 100 has a single-layer structure; however, the present disclosure is not limited thereto. For example, the buffer layer 100 may have a stack of a plurality of functional films.

A semiconductor pattern layer 700 may be disposed on the buffer layer 100. In an example, the semiconductor pattern layer 700 may include an inorganic semiconductor such as amorphous silicon or polysilicon. In another example, the semiconductor pattern layer 700 may include an organic semiconductor or an oxide semiconductor.

In an example, the semiconductor pattern layer 700 may include a source region and a drain region. A source electrode SE may be electrically connected to the source region of the semiconductor pattern layer 700, and a drain electrode DE may be electrically connected to the drain region of the semiconductor pattern layer 700.

A gate insulating layer GI may be disposed on the semiconductor pattern layer 700. The gate insulating layer GI may be formed on the entire surface of the first substrate 500. In other words, the gate insulating layer GI may be formed over the display area DA and the non-display area NDA.

In an example, the gate insulating layer GI may include silicon nitride, silicon oxide, silicon oxynitride, and/or the like.

A gate electrode GE may be disposed on the gate insulating layer GI. The gate electrode GE may include at least one of an aluminum-based metal including an Al alloy, a silver (Ag)-based metal including a Ag alloy, a copper (Cu)-based metal including a Cu alloy, a molybdenum (Mo)-based metal including a Mo alloy, chromium (Cr), titanium (Ti), tantalum (Ta), and/or the like.

An interlayer dielectric layer ILD may be disposed on the gate electrode GE to cover the gate electrode GE. The interlayer dielectric layer ILD may be formed on the entire surface of the first substrate 500. That is, the interlayer dielectric layer ILD may be formed over the display area DA and the non-display area NDA and may overlap the gate insulating layer GI.

The interlayer dielectric layer ILD may include silicon nitride, silicon oxide, silicon oxynitride, and/or the like.

FIG. 3 illustrates an example in which the interlayer dielectric layer ILD has a single-layer structure; however, the present disclosure is not limited thereto. For example, the interlayer dielectric layer ILD may have a stack of two or more functional layers.

The source electrode SE and the drain electrode DE are disposed on the interlayer dielectric layer ILD. The interlayer dielectric layer ILD may expose the source region and the drain region, and the source electrode SE and the drain electrode DE may be placed in contact with the semiconductor pattern layer 700 via the exposed source region and the exposed drain region. As a result, the source electrode SE and the drain electrode DE may be electrically connected to the semiconductor pattern layer 700.

A passivation layer 600 may be disposed on the source electrode SE, the drain electrode DE, and the interlayer dielectric layer ILD. The passivation layer 600 may partially cover the interlayer dielectric layer ILD. The passivation layer 600 may be formed to partially expose the drain electrode DE.

An anode electrode AN, a middle layer EL, and a cathode electrode CA may be disposed on the passivation layer 600. The anode electrode AN, the middle layer EL, and the cathode electrode CE may form an organic light-emitting element together.

The anode electrode AN may be formed on the passivation layer 600 and may be placed in contact with part of the drain electrode DE exposed by the passivation layer 600. That is, the anode electrode AN may be electrically connected to the drain electrode DE.

In an example, the anode electrode AN may be a reflective electrode and may include at least one reflective layer formed of Ag, Mg, Al, Pt, Pd, Au, Ni, Nd, Ir, Cr, and/or the like, and may further include a transparent or translucent electrode formed on the reflective layer.

The transparent or translucent electrode of the anode electrode AN may be formed of indium tin oxide (ITO), indium zinc oxide (IZO), zinc oxide (ZnO), indium oxide ($In_2O_3$), indium gallium oxide (IGO), aluminum zinc oxide (AZO), and/or the like.

A pixel defining layer PDL, which is formed of an insulating material, may be disposed on the anode electrode AN. The pixel defining layer PDL may at least partially expose the anode electrode AN.

The middle layer EL may be disposed on part of the anode electrode AN exposed by the pixel defining layer PDL.

The middle layer EL may include an organic light-emitting layer formed of a low- or high-molecular organic material.

In an example, the middle layer EL may further include a hole transfer layer (HTL), a hole injection layer (HIL), an electron transfer layer (ETL), an electron injection layer (EIL), and/or the like.

The cathode electrode CA may be disposed on the anode electrode AN. In an example, the cathode electrode CA may be formed on the entire surface of the substrate 500 as a front electrode.

That is, in an example, the cathode electrode CA may be formed over the display area DA and the non-display area NDA, and the anode electrode AN may be disposed only in the display area DA.

In an example, the cathode electrode CA may be a transparent or translucent electrode. In an example, the cathode electrode CA may include Li, Ca, LiF/Ca, LiF/Al, Al, Ag, Mg, and/or the like. Also, the cathode electrode CA may be formed of a metal thin film having a low work function.

In an example, the cathode electrode CA, that is, the transparent or translucent electrode, may be formed of ITO, IZO, ZnO, $In_2O_3$, IGO, AZO, and/or the like.

The display device according to the exemplary embodiment of FIG. 1 may be a top emission type display device in which light generated by the middle layer EL is emitted toward the cathode electrode CA.

The display device according to the exemplary embodiment of FIG. 1 may be a bottom emission type display device in which light generated by the middle layer EL is emitted toward the anode electrode AN. In this case, the cathode electrode AN may be a reflective electrode, and the anode electrode AN may be a transparent or semitransparent electrode.

The display device according to the exemplary embodiment of FIG. 1 may be a double-sided emission type display device in which light generated by the middle layer EL is emitted toward the anode electrode AN and the cathode electrode CA.

In an example, the seal pattern SLP may be disposed to be spaced apart from the display area DA. The seal pattern SLP may be disposed to surround the display area DA, as illustrated in FIG. 1.

In an example, the seal pattern SLP may include frit. For example, the seal pattern SLP may be obtained by melting frit.

For convenience, referring to FIGS. 2 and 3, a middle area MA may be defined as an area provided in the non-display area NDA between the display area DA and the seal pattern SLP.

In an example, the middle area MA may have a rectangular frame shape surrounding the display area DA.

Figure 5:
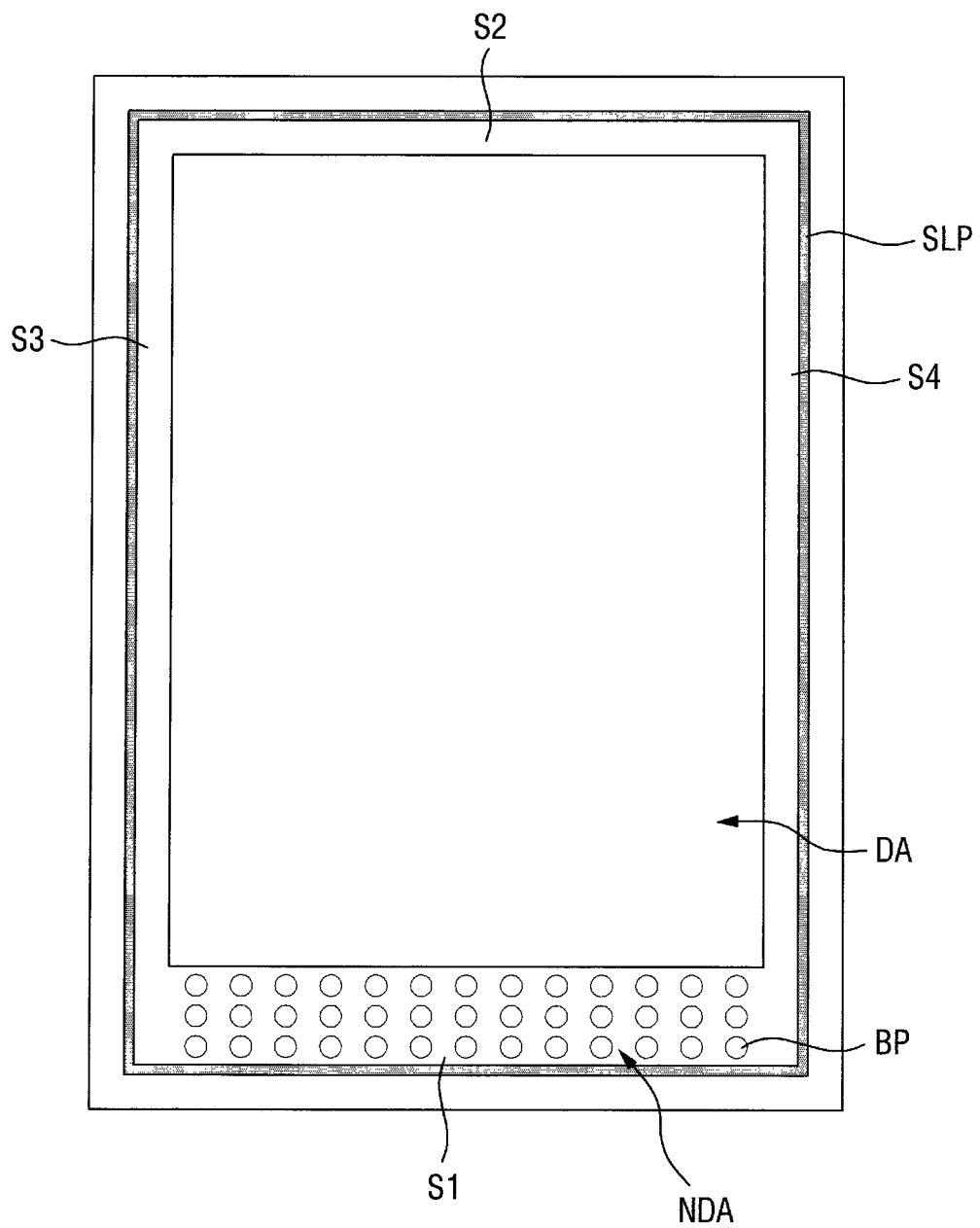
FIG. 5 is a layout view of a display device according to another exemplary embodiment of the present disclosure.

In an example, the middle area MA may include first through fourth sides S1 through S4, as illustrated in FIG. 5.

The first side S1 may be disposed below the display area DA and may be opposite to the second side S2. The first side S1 may have a greater area than the second side S2.

In an example, the pads may be provided on the first side S1 and/or in the non-display area NDA adjacent to the first side S1. That is, in order to provide room for the pads, the first side S1 may be formed to have a greater area than the second side S2.

The third and fourth sides S3 and S4 may connect the first and second sides S1 and S2. The third and fourth sides S3 and S4 may be opposite to each other.

For example, the first through fourth sides S1 through S4 may correspond to the four sides of the middle area MA, which has a rectangular shape.

Referring again to FIG. 3, in an example, the buffer patterns BP may be disposed in the middle area MA.

The buffer patterns BP may be disposed between the first and second substrates 500 and 1000 and may support the first and second substrates 500 and 1000.

The buffer patterns BP may be disposed to overlap circuits or insulating layers disposed in the middle area MA.

FIG. 3 illustrates an example in which the buffer patterns BP overlap the anode electrode AN and the cathode electrode CA.

The buffer patterns BP may also overlap other circuit patterns.

In an example, the buffer patterns BP may overlap at least one selected from the group consisting of the pixel defining layer PDL, the interlayer dielectric layer ILD, and the passivation layer 600.

In an example, the buffer patterns BP may have a viscosity of 5000 cps to 50000 cps.

In a case where the viscosity of the buffer patterns BP is less than 5000 cps, the shape of the buffer patterns BP may not be able to be maintained, or there is a likelihood that the buffer patterns BP either infiltrate into the seal pattern SLP to lower the adhesiveness of the seal pattern SLP or infiltrate into the display area DA to cause display defects.

In a case where the viscosity of the buffer patterns BP exceeds 50000 cps, the buffer patterns BP may not be able to be properly spread over the middle area MA due to too high viscosity. The buffer patterns BP may be applied by inkjet printing. However, if the viscosity of the buffer patterns BP exceeds 50000 cps, the nozzle of an inkjet printer may be clogged, and as a result, the buffer patterns BP may not be able to be properly applied.

On the other hand, in a case where the buffer patterns BP have a viscosity of 5000 cps to 50000 cps, the buffer patterns BP may soften or alleviate the impact applied to the display device according to the exemplary embodiment of FIG. 1.

Figure 16:
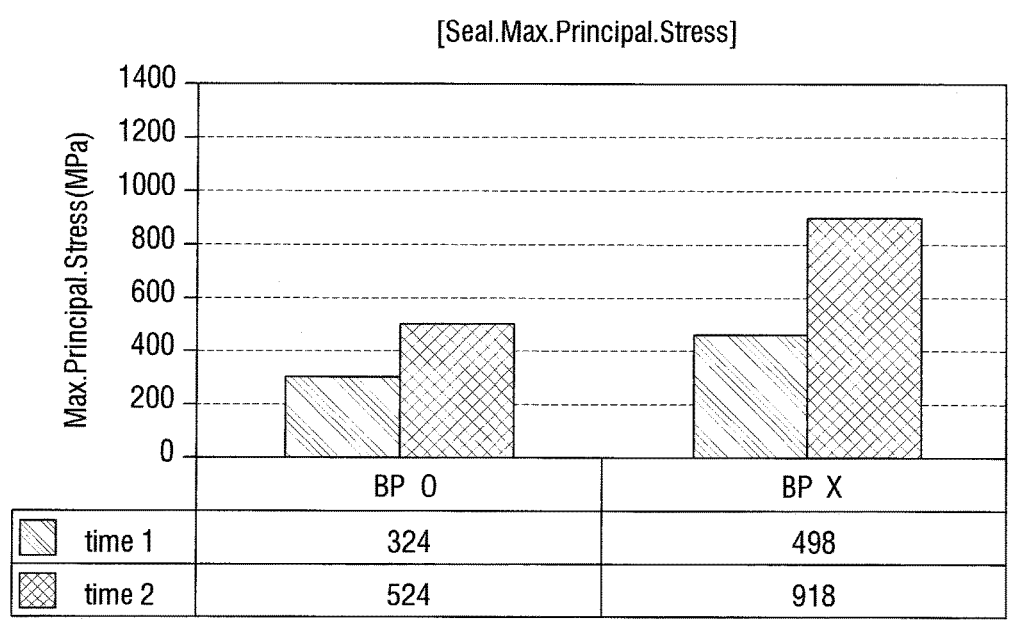
FIG. 16 is a graph illustrating a comparison between an impact-induced stress in the display device, according to an embodiment, with that in the related art.

FIG. 16 is a graph illustrating a comparison between an impact-induced stress in the display device, according to an embodiment, with that in the related art.

FIG. 16 shows the maximum principal stress applied to each display device at arbitrary first and second times "time1" and "time2" during an impact test.

Referring to FIG. 16, at the first and second times "time1" and "time2", the stress applied to a display device "BP O" with the buffer patterns BP is less than the stress applied to a display device "BP X" without the buffer patterns BP.

In an example, the buffer patterns BP may be formed of a material that does not cause outgasing. During the fabrication of the semiconductor device, heat may be applied to the buffer patterns BP. Because the buffer patterns BP are disposed on the inside of the seal pattern SLP, outgasing may be caused by the buffer patterns BP, thereby causing damage to the display area DA. In order to address this problem, the buffer patterns BP may include, for example, silicon (Si).

In an example, the buffer patterns BP may have adhesiveness. In a case where the buffer patterns BP have adhesiveness, the first and second substrates 500 and 1000 may be stably bonded together.

That is, the first and second substrates 500 and 1000 may be bonded mostly by the seal pattern SLP; however, in a case where the buffer patterns BP with adhesiveness are provided, the buffer patterns BP may assist the seal pattern SLP in bonding the first and second substrates 500 and 1000. As a result, the bonding between the first and second substrates 500 and 1000 may be stably maintained.

Referring again to FIG. 1, the buffer patterns BP may be disposed in the middle area MA.

In an example, the buffer patterns BP may be disposed on at least one of the first through fourth sides S1 through S4.

FIG. 1 illustrates an example in which the buffer patterns BP are disposed on the first through fourth sides S1 through S4; however, the arrangement of the buffer patterns BP is not limited thereto.

In an example, the number of buffer patterns BP per unit area may be greater on the first side S1 than on the second, third, or fourth side S2, S3, or S4.

As described above, the first side S1 may have a greater area than the second through fourth sides S2 through S4, and as a result, more buffer patterns BP may be provided on the first side S1 than on the second, third, or fourth side S2, S3, or S4. In other words, the total area occupied by the buffer patterns BP on the first side S1 may be greater than the total area occupied by the buffer patterns BP on the second side S2.

In an example, the buffer patterns BP may be arranged in two rows on the first side S1 and in a single row on the second, third, or fourth side S2, S3, or S4.

In an example, the buffer patterns BP may be spaced apart from one another; however, the present disclosure is not limited thereto. For example, the buffer patterns BP may be disposed to be placed in contact with one another.

Figure 4:
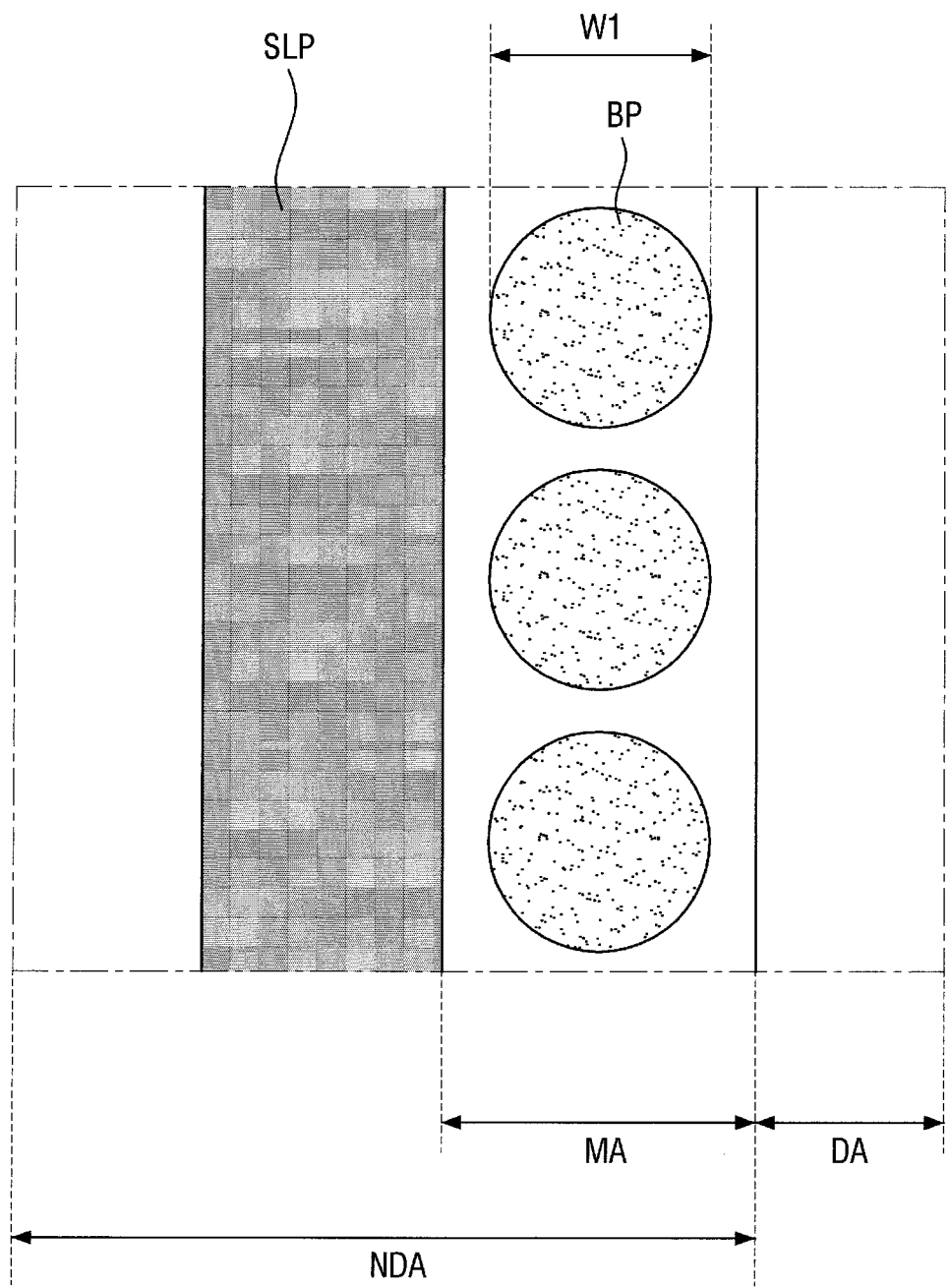
FIG. 4 is an enlarged view of the area B of FIG. 1.

FIG. 4 is an enlarged view of the area B of FIG. 1.

Referring to FIG. 4, a first width W1 of the buffer patterns BP may be less than the width of the middle area MA. In other words, the buffer patterns BP may be disposed on the inside of the boundary of the middle area MA.

If the buffer patterns BP infiltrate into the seal pattern SLP, the bonding force between the first and second substrates 500 and 1000 may weaken. On the other hand, if the buffer patterns BP infiltrate into the display area DA, display defects may be caused.

Accordingly, the buffer patterns BP may be disposed on the inside of the boundary of the middle area MA.

Referring again to FIG. 3, the second substrate 1000 may be disposed on the buffer patterns BP.

In an example, the second substrate 1000 may be an encapsulation substrate or an encapsulation layer.

FIG. 3 illustrates an example in which the second substrate 1000 has a single-layer structure; however, the present disclosure is not limited thereto. For example, the second substrate 1000 may have a stack of a plurality of functional films.

Display devices according to other exemplary embodiments of the present disclosure will hereinafter be described. In FIGS. 1 through 15, like reference numerals indicate like elements, and thus, descriptions thereof will be omitted or at least simplified.

FIG. 5 is a layout view of a display device according to another exemplary embodiment of the present disclosure.

Referring to FIG. 5, the display device according to the exemplary embodiment of FIG. 5 differs from the display device according to the exemplary embodiment of FIG. 1 in that buffer patterns BP are formed only on a first side S1.

The buffer patterns BP may be formed only in part of a middle area MA.

That is, in an example, the buffer patterns BP may be formed only on the first side S1. The buffer patterns BP may be arranged in a plurality of rows and columns on the first side S1. FIG. 5 illustrates an example in which the buffer patterns BP are arranged in three rows.

Figure 6:
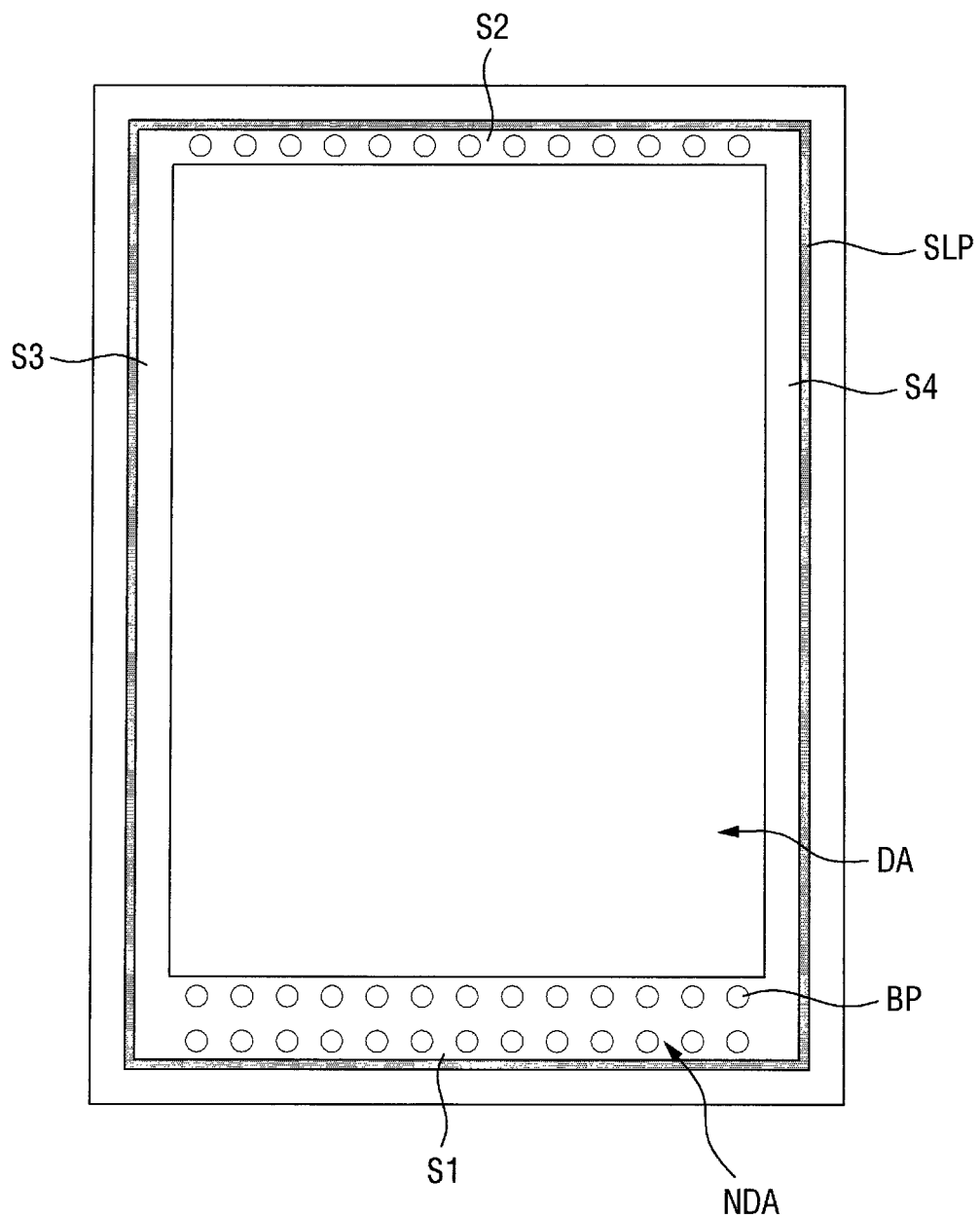
FIG. 6 is a layout view of a display device according to another exemplary embodiment of the present disclosure.

FIG. 6 is a layout view of a display device according to another exemplary embodiment of the present disclosure.

Referring to FIG. 6, the display device according to the exemplary embodiment of FIG. 6 differs from the display device according to the exemplary embodiment of FIG. 1 in that buffer patterns BP are formed only on first and second sides S1 and S2.

More buffer patterns BP may be arranged on the first side S1 than on the second side S2 because of the difference in area between the first and second sides S1 and S2.

Figure 7:
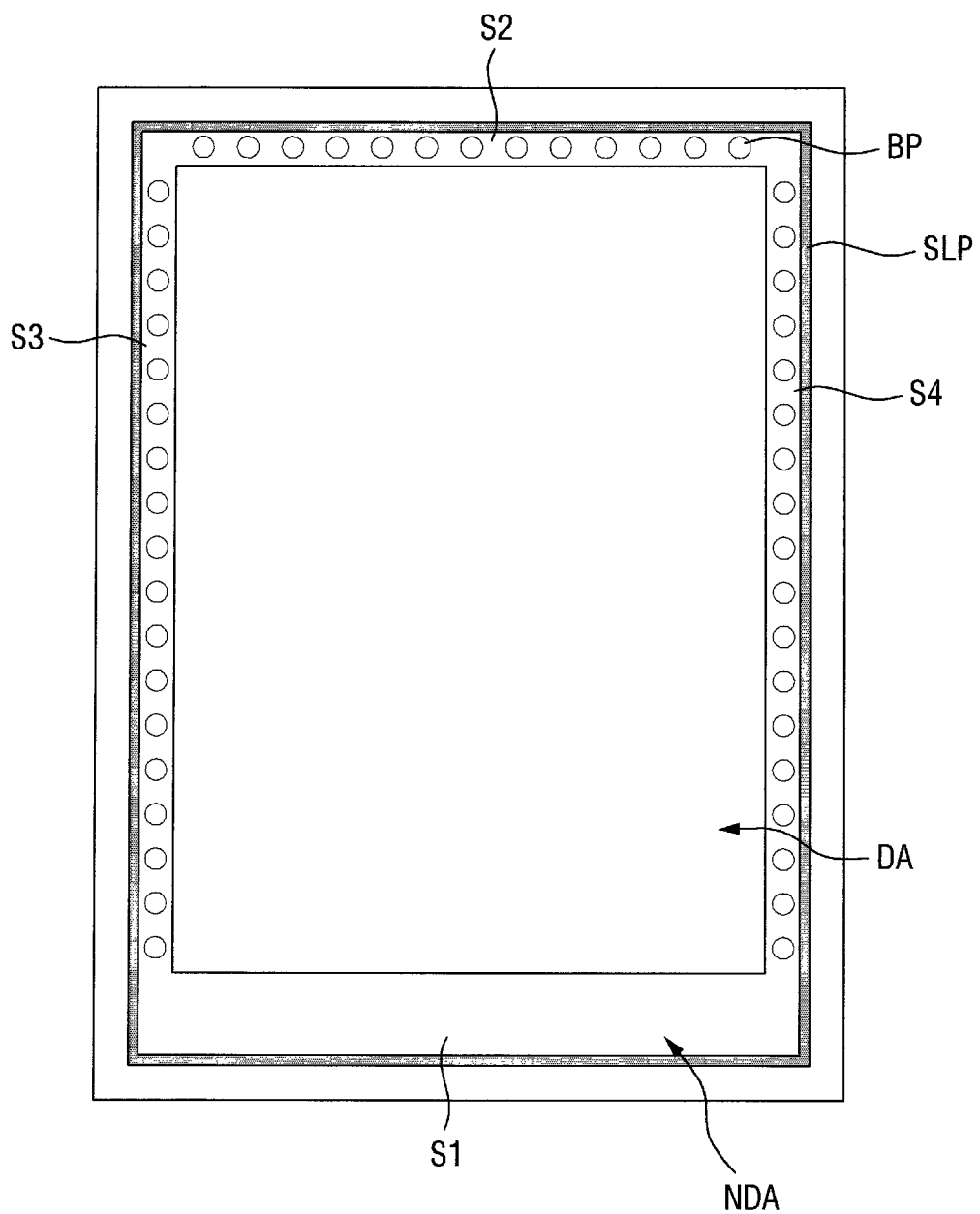
FIG. 7 is a layout view of a display device according to another exemplary embodiment of the present disclosure.

FIG. 7 is a layout view of a display device according to another exemplary embodiment of the present disclosure.

Referring to FIG. 7, the display device according to the exemplary embodiment of FIG. 7 differs from the display device according to the exemplary embodiment of FIG. 1 in that buffer patterns BP are formed on second, third, and fourth sides S2, S3, and S4, and not on a first side S1.

In an example, the buffer patterns BP may not be formed on the first side S1, and may be formed only on the second, third, and fourth sides S2, S3, and S4.

In an example, in order to reduce dead space, the buffer patterns BP may be arranged in a single row on each of the second, third, and fourth sides S2, S3, and S4.

Figure 8:
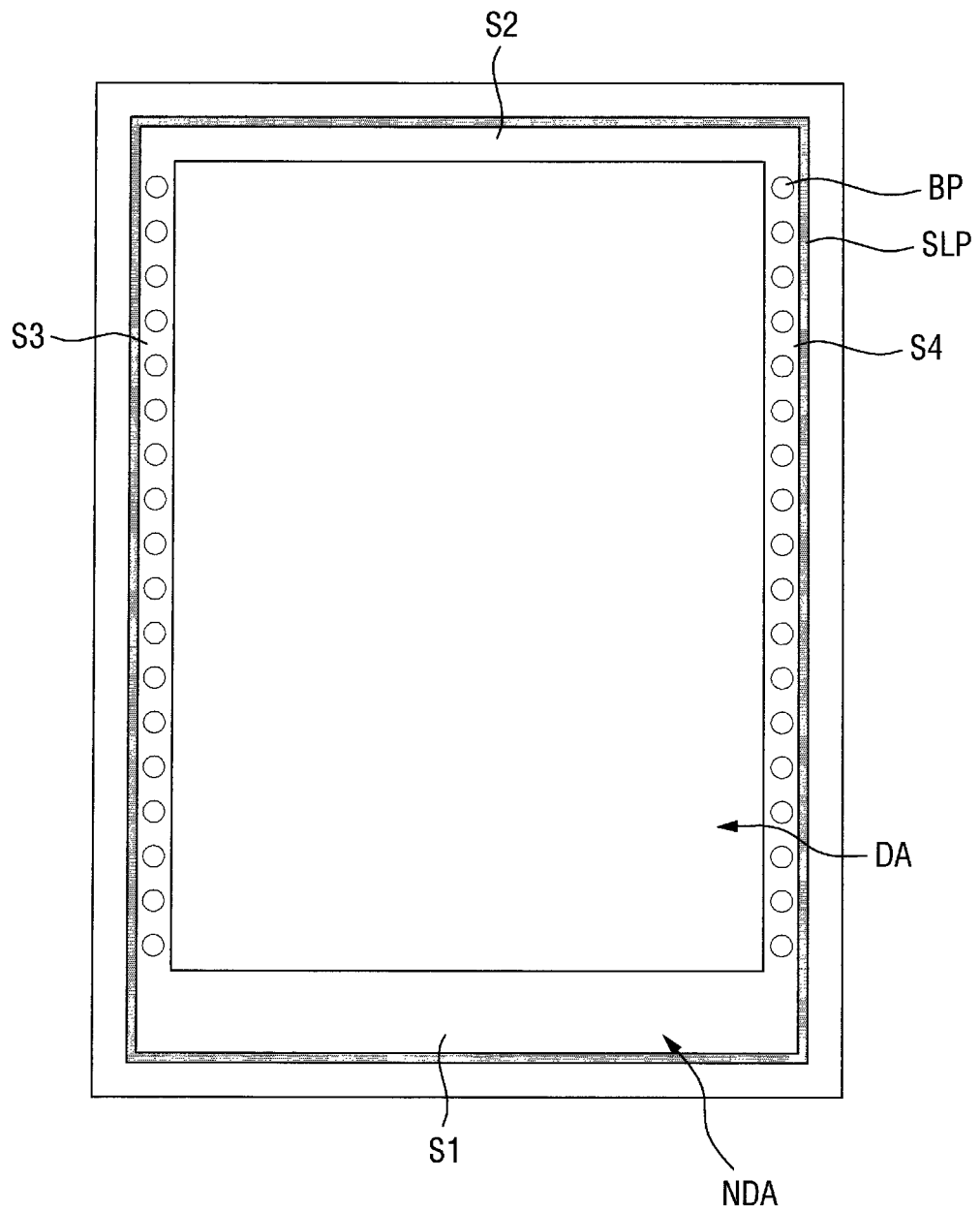
FIG. 8 is a layout view of a display device according to another exemplary embodiment of the present disclosure.

FIG. 8 is a layout view of a display device according to another exemplary embodiment of the present disclosure.

Referring to FIG. 8, the display device according to the exemplary embodiment of FIG. 8 differs from the display device according to the exemplary embodiment of FIG. 1 in that buffer patterns BP are formed only on third and fourth sides S3 and S4.

In an example, the buffer patterns BP may be disposed only on the third and fourth sides S3 and S4. In order to reduce dead space, the buffer patterns BP may be arranged in a single row on each of the third and fourth sides S3 and S4.

Figure 9:
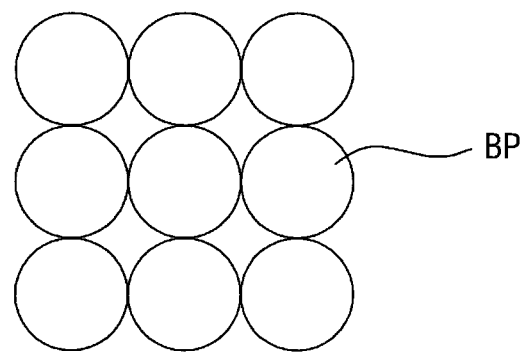
FIG. 9 is an enlarged view of a group of buffer patterns according to another exemplary embodiment of the present disclosure.

FIG. 9 is an enlarged view of a group of buffer patterns according to another exemplary embodiment of the present disclosure.

Referring to FIG. 9, buffer patterns BP may be arranged in a matrix of rows and columns.

The buffer patterns BP may be disposed to be placed in contact with one another.

FIG. 9 illustrates an example in which the buffer patterns BP are arranged in a matrix of three rows and three columns; however, the numbers of rows and columns of the matrix are not limited thereto.

Figure 10:
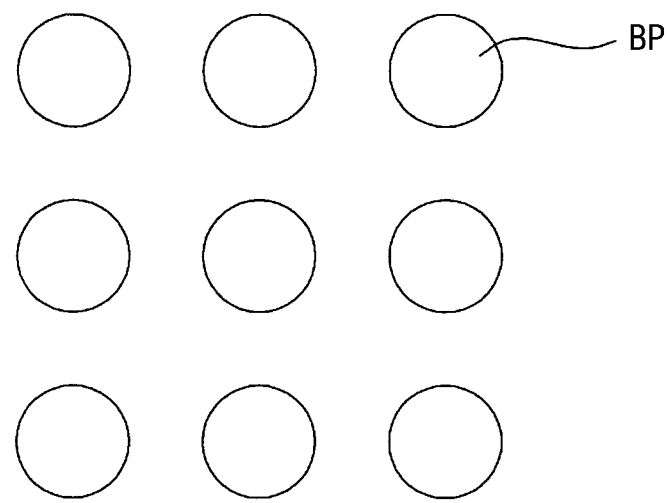
FIG. 10 is an enlarged view of a group of buffer patterns according to a modified example of the exemplary embodiment of FIG. 9.

FIG. 10 is an enlarged view of a group of buffer patterns according to a modified example of the exemplary embodiment of FIG. 9.

Referring to FIG. 10, the display device according to the exemplary embodiment of FIG. 10 differs from the display device according to the exemplary embodiment of FIG. 9 in that a plurality of buffer patterns BP are spaced apart from one another.

In an example, the buffer patterns BP may be spaced apart from one another. Accordingly, the buffer patterns BP may be prevented or substantially prevented from agglomerating together and being irregularly charged.

Figure 11:
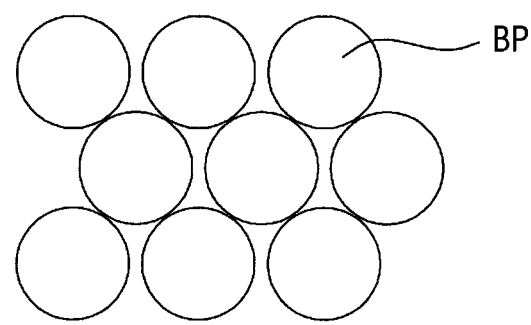
FIG. 11 is an enlarged view of a group of buffer patterns according to another exemplary embodiment of the present disclosure.

FIG. 11 is an enlarged view of a group of buffer patterns according to another exemplary embodiment of the present disclosure.

Referring to FIG. 11, buffer patterns BP may be arranged in a staggered manner.

In an example, the buffer patterns BP may be arranged in a zigzag manner, in a staggered manner, or in an irregular manner.

In an example, in a staggered arrangement of the buffer patterns BP, each pair of diagonally adjacent buffer patterns BP may be placed in contact with each other.

Figure 12:
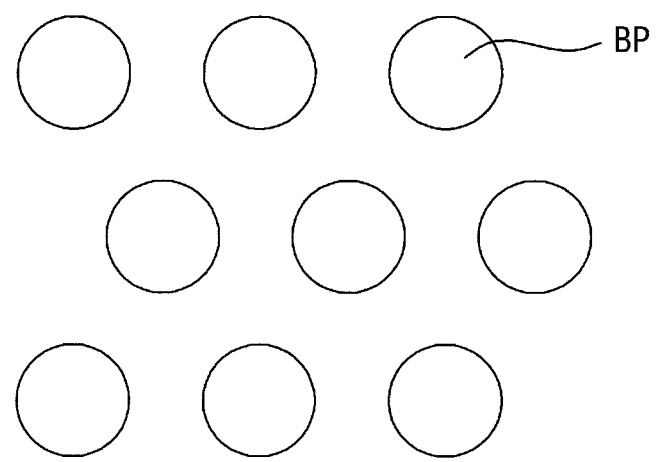
FIG. 12 is a partial enlarged view of a display device according to a modified example of the exemplary embodiment of FIG. 11.

FIG. 12 is a partial enlarged view of a display device according to a modified example of the exemplary embodiment of FIG. 11. Referring to FIG. 12, buffer patterns BP may be arranged in a staggered manner to be spaced apart from one another. Accordingly, the buffer patterns BP may be prevented or substantially prevented from agglomerating together and being irregularly charged.

Figure 13:
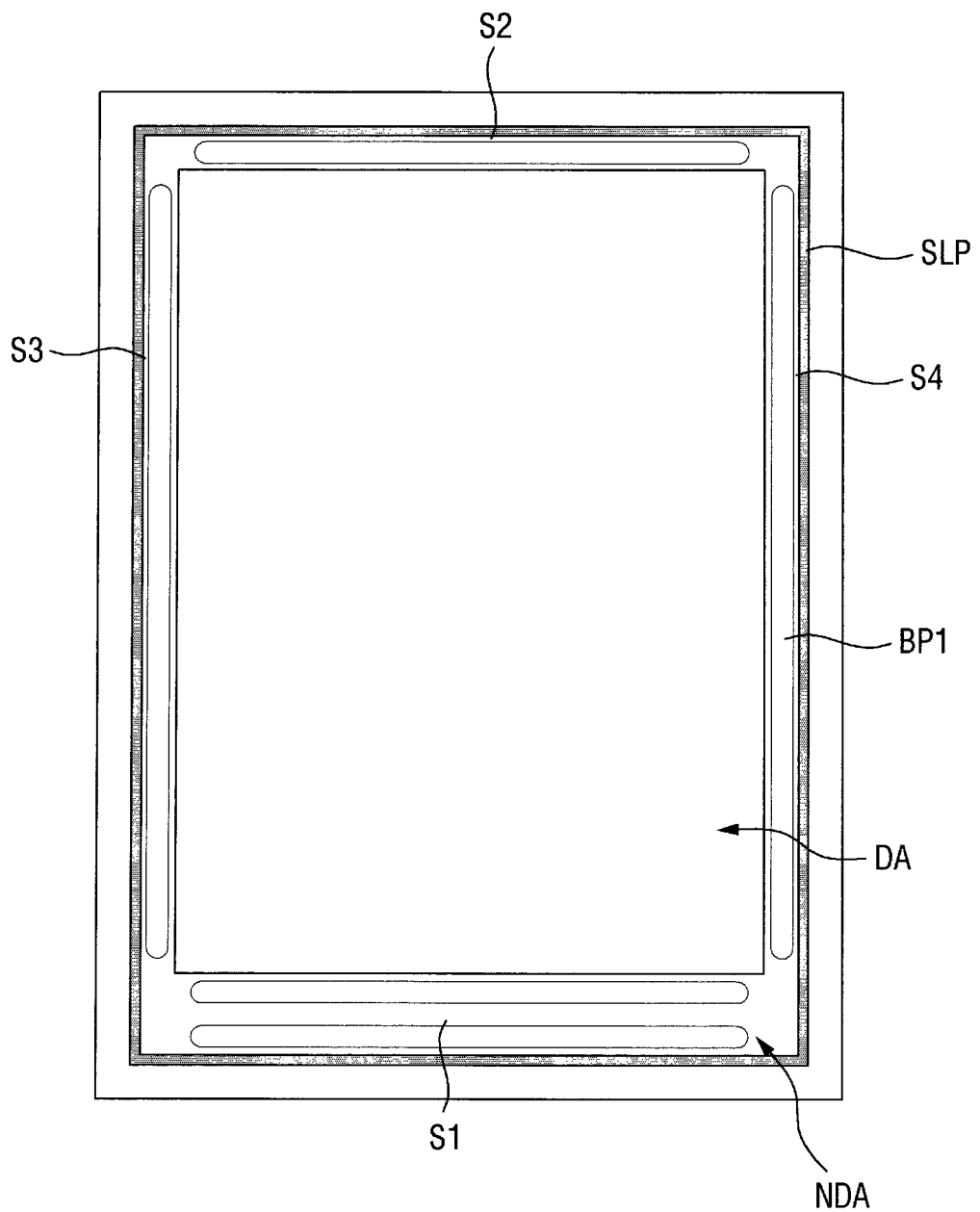
FIG. 13 is a layout view of a display device according to another exemplary embodiment of the present disclosure.

FIG. 13 is a layout view of a display device according to another exemplary embodiment of the present disclosure.

Referring to FIG. 13, the display device according to the exemplary embodiment of FIG. 13 differs from the display device according to the exemplary embodiment of FIG. 3 in that buffer patterns BP1 are linearly elongated.

In an example, the buffer patterns BP1 may have a bar shape extending in a longitudinal direction thereof.

In an example, two or more buffer patterns BP1 may be provided on a first side S1 to extend in parallel.

In an example, one buffer pattern BP1 may be provided on, and extend along, each of second through fourth sides S2 through S4.

Figure 14:
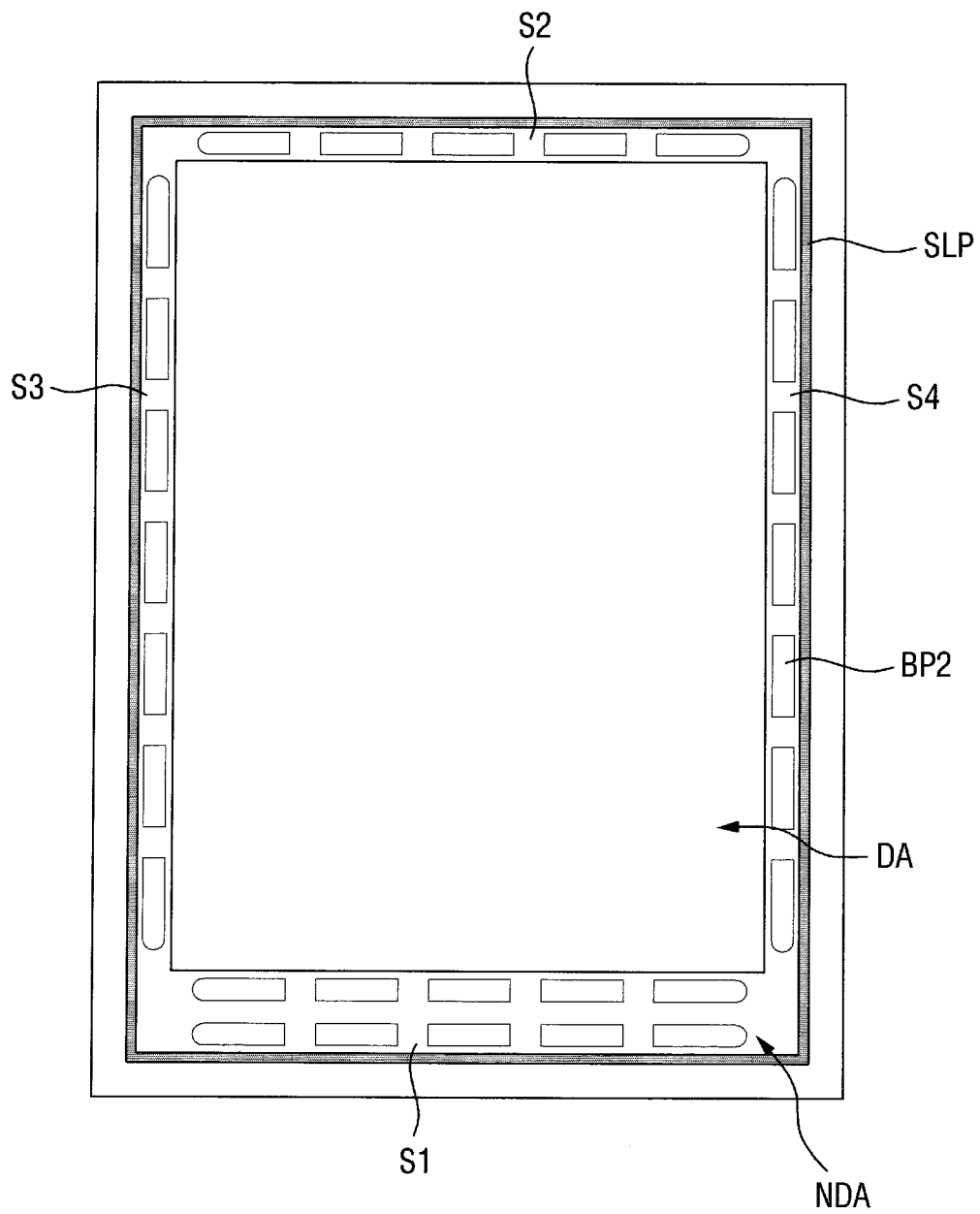
FIG. 14 is a layout view of a display device according to a modified example of the exemplary embodiment of FIG. 13.

FIG. 14 is a layout view of a display device according to a modified example of the exemplary embodiment of FIG. 13.

Referring to FIG. 14, the display device according to the exemplary embodiment of FIG. 14 differs from the display device according to the exemplary embodiment of FIG. 13 in that buffer patterns BP2 are elongated bars that are intermittently arranged.

In an example, the buffer patterns BP2 may have a bar shape. The buffer patterns BP2, which are bar-shaped, may be arranged along a longitudinal direction thereof.

The buffer patterns BP2, which are bar-shaped, may be arranged on each of first through fourth sides S1 through S4 in the longitudinal direction thereof.

In an example, the buffer patterns BP2 may be arranged in two or more rows on the first side S1 and in a single row on each of the second through fourth sides S2 through S4.

Figure 15:
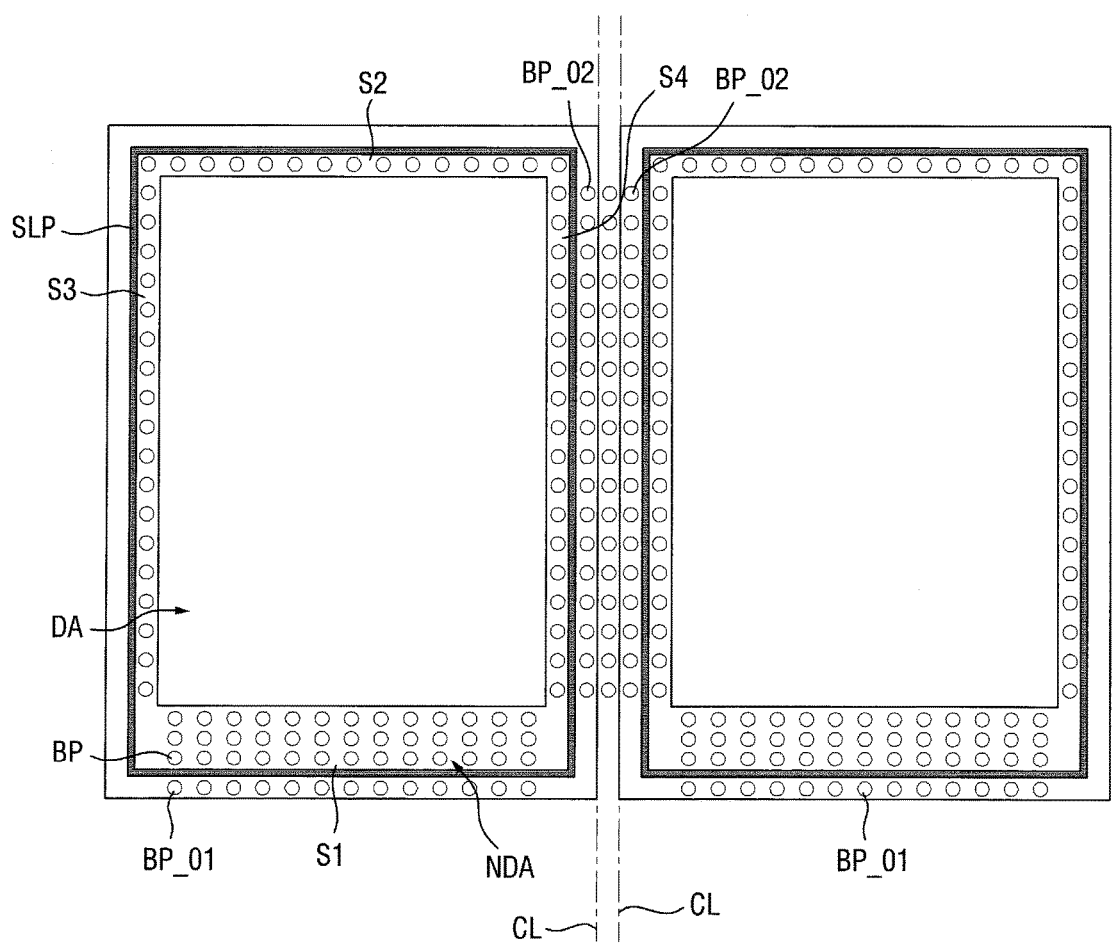
FIG. 15 is a layout view of a display device according to another exemplary embodiment of the present disclosure.

FIG. 15 is a layout view of a display device according to another exemplary embodiment of the present disclosure.

In particular, FIG. 15 shows a mother unit display device.

Referring to FIG. 15, in an example, a sheet-unit display device may be formed and may be cut later into a plurality of individual cells.

That is, the sheet-unit display device may be cut along cutting lines CL, thereby obtaining the individual cells.

In an example, outer buffer patterns (BP_01 and BP_02) may be disposed outside each seal pattern SLP.

FIG. 15 illustrates an example in which first outer buffer patterns BP_01 are disposed near a first side S1 and second outer buffer patterns BP_02 are disposed near a fourth side S4; however, the present disclosure is not limited thereto.

For example, the outer buffer patterns (BP_01 and BP_02) may be disposed on the outside of at least one of the first through fourth sides S1 and S4.

A manufacturing method of a display device according to an exemplary embodiment of the present disclosure will hereinafter be described. In FIGS. 1 through 15 and 17 through 20, like reference numerals indicate like elements, and thus, descriptions thereof will be omitted or at least simplified.

FIGS. 17 through 20 are cross-sectional views illustrating a manufacturing method of a display device according to an exemplary embodiment of the present disclosure.

Referring to FIGS. 17 through 20, the manufacturing method includes forming a seal pattern SLP on a second substrate 1000; forming buffer patterns on the inside of the seal pattern SLP; preparing a first substrate 500 that is opposite to the second substrate 1000 and on which a display area DA and a non-display area NDA on the outside of the display area DA are defined; bonding the first and second substrates 500 and 1000; and partially curing the buffer patterns BP by applying heat to a structure obtained by bonding the first and second substrates 500 and 1000.

Figure 17:
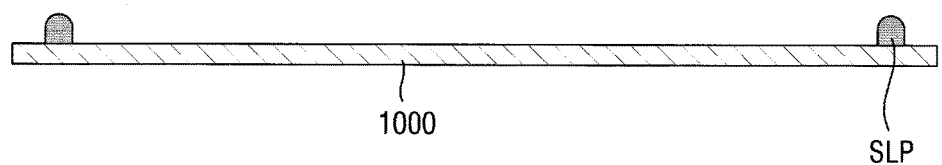
FIGS. 17 through 20 are cross-sectional views illustrating a manufacturing method of a display device according to an exemplary embodiment of the present disclosure.

Referring to FIG. 17, the seal pattern SLP may be formed on the second substrate 1000. The second substrate 1000 and the seal pattern SLP may be substantially the same as their respective counterparts of each of the display devices according to the aforementioned exemplary embodiments of the present disclosure.

In an example, the seal pattern SLP may be applied onto the second substrate 1000 in the shape of a frame with a hollow section (e.g., a hollow interior).

The seal pattern SLP may include frit.

Figure 18:
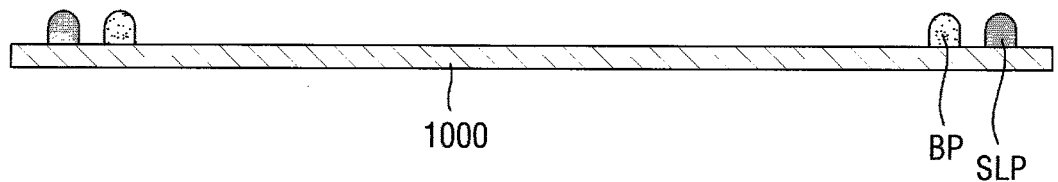

Thereafter, referring to FIG. 18, the buffer patterns BP may be formed on the inside of the seal pattern SLP. The buffer patterns BP may be applied by inkjet printing, screen coating, and nozzle coating.

The characteristics and the arrangement of the buffer patterns BP may be substantially the same as the characteristics and the arrangement of the buffer patterns of each of the display devices according to the aforementioned exemplary embodiments of the present disclosure. For example, the buffer patterns BP may have a viscosity of 5000 cps to 50000 cps.

Figure 19:
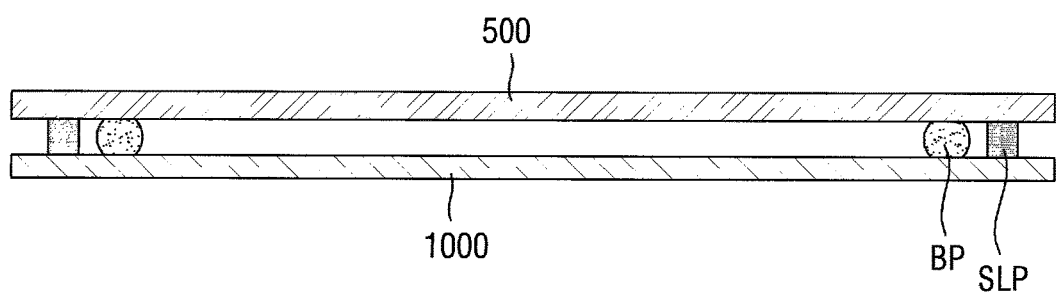

Thereafter, referring to FIG. 19, the first substrate 500, which is opposite to the second substrate 1000 and on which the display area DA and the non-display area NDA on the outside of the display area DA are defined, may be prepared, and the first and second substrates 500 and 1000 may be bonded.

The first substrate 500 may be substantially the same as its counterpart of each of the display devices according to the aforementioned exemplary embodiments of the present disclosure. Various elements such as those described above with reference to FIG. 3 may be disposed in the display area DA of the first substrate 500.

The bonding of the first and second substrates 500 and 1000 may include aligning the first and second substrates 500 and 1000. In this case, the seal pattern SLP and the buffer patterns BP may be aligned to face the non-display area NDA of the first substrate 500.

For example, the bonding of the first and second substrates 500 and 1000 may include aligning a middle area MA of the first substrate 500 and the buffer patterns BP of the second substrate 1000.

Thereafter, the first and second substrates 500 and 1000 may be made to come close to each other. In response to the first and second substrates 500 and 1000 coming close to each other, the buffer patterns BP may be pressed by the first and second substrates 500 and 1000. Because the buffer patterns BP have viscosity, the buffer patterns BP may be expanded in a horizontal direction by pressure applied thereto in a vertical direction. Even in this case, the buffer patterns BP may not cross the boundary of the middle area MA, as illustrated in FIG. 4.

In a case where the seal pattern SLP includes frit, the bonding of the first and second substrates 500 and 1000 may further include curing the frit by applying laser light to the seal pattern SLP. In response to the first and second substrates 500 and 1000 being bonded together with the middle area MA of the first substrate 500 aligned with the buffer patterns BP of the second substrate 1000, the buffer patterns BP may be disposed in the middle area MA of the first substrate 500.

Figure 20:
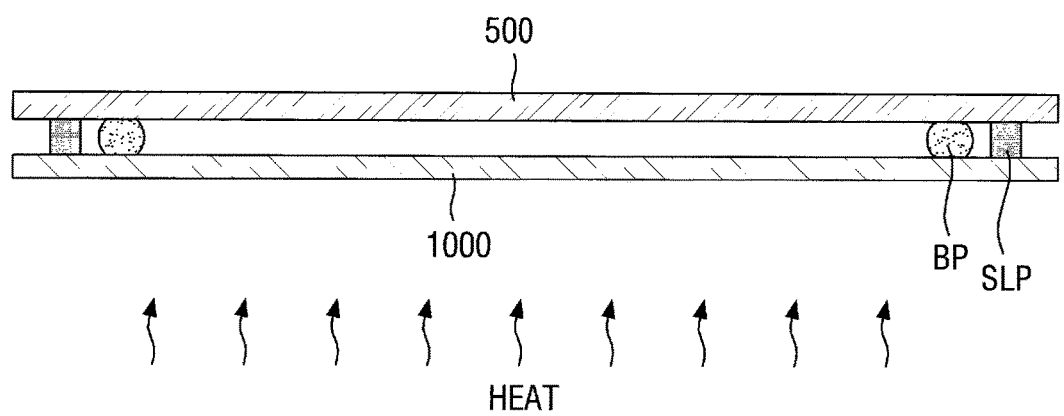

Thereafter, referring to FIG. 20, the buffer patterns BP may be partially cured by applying heat to the structure obtained by bonding the first and second substrates 500 and 1000.

For example, if heat is applied to the structure obtained by bonding the first and second substrates 500 and 1000, the buffer patterns BP may be at least partially cured. Once the buffer patterns BP are at least partially cured, the buffer patterns BP may be fixed.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

While the present invention has been particularly illustrated and described with reference to exemplary embodiments thereof, it will be understood by those of ordinary skill in the art that various changes in form and detail may be made therein without departing from the spirit and scope of the present invention as defined by the following claims and equivalents thereof. The exemplary embodiments should be considered in a descriptive sense and not for purposes of limitation.

What is claimed is:

1. A display device comprising:
a first substrate having a display area and a non-display area around the display area;
a seal pattern in the non-display area and offset from the display area; and
one or more buffer patterns between the seal pattern and the display area,
wherein the one or more buffer patterns has a viscosity of 5000 cps to 50000 cps.

2. The display device of claim 1, wherein a middle area is defined between the display area and the seal pattern, and
wherein the one or more buffer patterns are in the middle area.

3. The display device of claim 2, wherein a width of the one or more buffer patterns is less than a width of the middle area.

4. The display device of claim 2, wherein the middle area has a first side and a second side opposite to the first side, and
wherein the first side has a greater area than the second side.

5. The display device of claim 4, wherein the middle area further has third and fourth sides connecting the first and second sides.

6. The display device of claim 5, wherein the one or more buffer patterns are on at least one of the first through fourth sides.

7. The display device of claim 6, wherein the one or more buffer patterns are arranged in a single row on each of the third and fourth sides.

8. The display device of claim 4, wherein the one or more buffer patterns comprise a plurality of buffer patterns, and a total area occupied by ones of the plurality of buffer patterns on the first side is greater than a total area occupied by ones of the plurality of buffer patterns on the second side.

9. The display device of claim 4, wherein the one or more buffer patterns on the first side are arranged in a matrix of rows and columns.

10. The display device of claim 2, wherein the one or more buffer patterns have an elongated bar shape.

11. The display device of claim 1, wherein the one or more buffer patterns have adhesiveness.

12. The display device of claim 1, wherein the buffer patterns comprise silicon.

13. The display device of claim 1, wherein the one or more buffer patterns comprise a plurality of buffer patterns, and
wherein the plurality of buffer patterns are in contact with one another.

14. The display device of claim 1, wherein the one or more buffer patterns comprise a plurality of buffer patterns, and
wherein the plurality of buffer patterns are spaced from one another.

15. The display device of claim 1, further comprising:
outer buffer patterns on the outside of the seal pattern.

* * * * *